United States Patent [19]

Sakakibara et al.

[11] Patent Number: 4,625,262
[45] Date of Patent: Nov. 25, 1986

[54] POINTER ILLUMINATING STRUCTURE IN MEASURING INSTRUMENT

[75] Inventors: Yutaka Sakakibara; Hidetaka Ueda; Kunio Majima, all of Shimada, Japan

[73] Assignee: Yazaki Corporation, Tokyo, Japan

[21] Appl. No.: 628,278

[22] Filed: Jul. 6, 1984

[30] Foreign Application Priority Data

Jul. 8, 1983 [JP] Japan .............................. 58-105444[U]
Aug. 19, 1983 [JP] Japan .............................. 58-127221[U]
Aug. 19, 1983 [JP] Japan .............................. 58-127222[U]

[51] Int. Cl.⁴ .......................... G01D 11/28; F21V 7/04
[52] U.S. Cl. ........................................ 362/26; 362/30; 362/32; 362/328; 362/346; 362/355
[58] Field of Search ............... 362/23, 26, 32, 29, 362/317, 327, 328, 341, 346, 347, 351, 355, 384, 431, 30

[56] References Cited

U.S. PATENT DOCUMENTS

| 2,290,278 | 7/1942 | Failla | 362/32 |
| 2,831,453 | 4/1958 | Hardesty | 362/26 |
| 4,195,907 | 4/1980 | Zamja et al. | 362/32 |
| 4,218,726 | 8/1980 | Fukasawa et al. | 362/26 |
| 4,380,043 | 4/1983 | Takamatsu et al. | 362/26 |

FOREIGN PATENT DOCUMENTS 688289  8/1930  France .............................. 362/26

Primary Examiner—Craig R. Feinberg

[57] ABSTRACT

A pointer illuminating structure in a measuring instrument. A pointer of the measuring instrument is of a generally elongated structure and transparent. At an intermediate portion thereof, a light section is provided to extend substantially prependicularly to the generally elongated structure to form a T shape. The pointer has a flat upper surface and lower surfaces extending from about both side of the light inducing section. A reflective material is applied to the lower surfaces. Beneath the upper surface and above levels of the lower surface, cavities laterally extend to open sideways. Said cavities are defined by reflective surfaces. In alternative form, said elongated pointer is formed with a truncated conical portion at the light inducing section. Said truncated conical portion has a truncated conical reflective surface. The reflective material is applied to the side surfaces instead of the lower surface thereof.

7 Claims, 44 Drawing Figures

FIG. 29
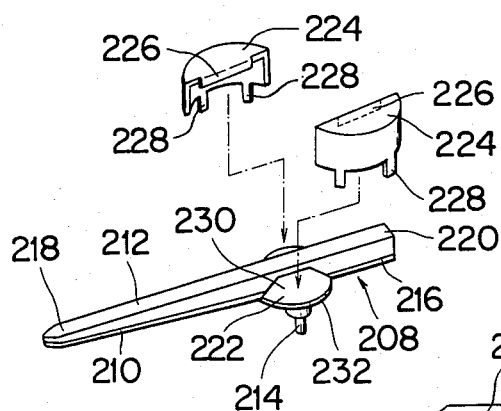
FIG. 32
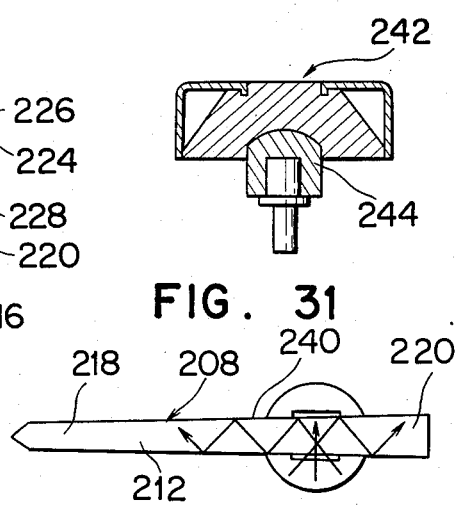
FIG. 31
FIG. 33
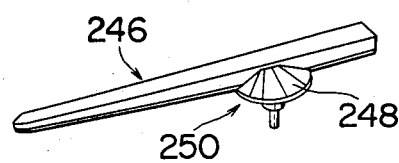
FIG. 34a
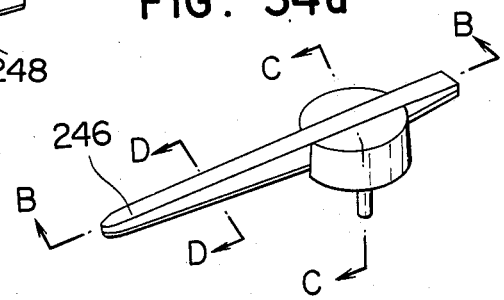
FIG. 34d
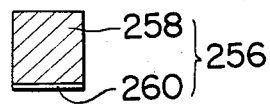
FIG. 34b
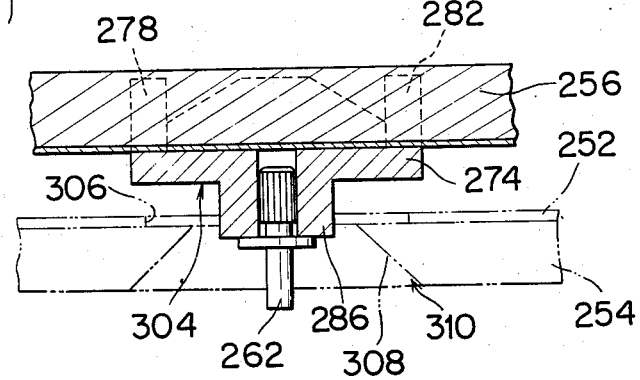

POINTER ILLUMINATING STRUCTURE IN MEASURING INSTRUMENT

BACKGROUND OF THE INVENTION

The present invention relates to a pointer illuminating structure in a measuring instrument.

Heretofore, a pointer illuminating structure has been demanded for improving the visuality of a measuring instrument when used during the night or for some reason concerned with design.

As conventional pointer illuminating structures, there are such devices as shown in FIGS. 1 to 3, of which FIGS. 1 and 3 are perspective views of different conventional pointer illuminating structures and FIG. 2 is a sectional view of the structure of FIG. 1 as mounted to a measuring instrument.

In FIG. 1, the numeral 6 denotes a pointer having a fore end portion 10 and a rear end portion 12, with a pointer cap 5 being fitted over an intermediate portion between the fore end portion 10 and the rear end portion 12 to cover that portion of the pointer 6. The numeral 7 denotes a pointer support shaft.

Operation of the conventional structure of FIG. 1 will now be described with reference to FIG. 2. The numeral 2 denotes a dial plate of measuring instrument (not shown). Light is radiated diretly from a light source (not shown) to a photoconductive plate 4 which is attached to the back of the dial plate 2. The radiated light is incident upon the circumference of a central light receiving portion 7 which is opposed to the photoconductive plate 4, then this incident light is reflected as indicated with arrows in FIG. 2 by a conical reflective surface 34 formed in the central light receiving portion and reaches the fore and rear end portions 10 and 12 of the pointer 6 to illuminate those portions.

In the structure of FIG. 3, the pointer 6 has only the fore end portion 10, not having the rear end portion 12, but the operation is the same as above.

In those conventional devices having such constructions and functions, however, since the pointer cap 5 for the prevention of light leak is sure to be fitted over the pointer 6, the luminous portion of the pointer 6 is scissioned by the pointer cap 5, thus making it impossible to illuminate the entirety of the pointer 6. That is, the visuality in nighttime use is low, and also in point of design, there are restrictions.

SUMMARY OF THE INVENTION

It is the object of the present invention to provide an improved pointer illuminating structure capable of overcoming the above-mentioned drawbacks of the conventional devices and improving the visuality in nighttime use by illuminating the entirety of a pointer as an integral body, and having a good design.

In order to achieve the above-mentioned object there is provided a pointer illuminating structure in a measuring instrument in which a pointer itself is illuminated by conducting light to the interior of the pointer, said pointer illuminating device including the pointer and a cap, said pointer comprising an upper transmissive colored portion, a lower reflective colored portion and a transparent portion disposed therebetween, said transparent portion being provided with a central reflecting portion having a plurality of sideways opened, hollow, curved reflective surfaces, and said cap covering, and said cap covering said central reflecting portion sideways and not covering the upper surface of the pointer.

BRIEF DESCRIPTION OF THE DRAWINGS

Other objects, features and advantages of the invention will become apparent as the description proceeds with reference to the drawings in which

FIGS. 28b to 28d are sectional views taken along lines B, C and D of FIG. 28a;

FIG. 29 is an exploded view of FIG. 28a;

FIG. 30 is a longitudinal sectional view of FIG. 28a;

FIG. 31 is a diagrammatic plan view of FIG. 28a showing the operation thereof;

FIG. 32 is a sectional view showing a modification of FIG. 30;

FIG. 33 is a perspective view showing another modification of FIG. 29;

FIG. 34a is a perspective view of a still further embodiment of the invention;

FIGS. 34b, 34c and 34d are sectional views taken along lines B, C and D;

FIG. 35 is an exploded perspective view of FIG. 34a;

DETAILED DESCRIPTION OF THE EMBODIMENTS

The present invention will be described concretely hereinunder with reference to the drawings.

Figure 1:
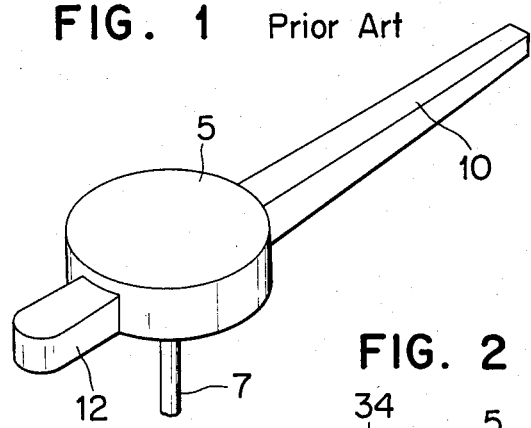
FIG. 1 is a perspective view showing one type of the conventional pointer illuminating structure.
Figure 2:
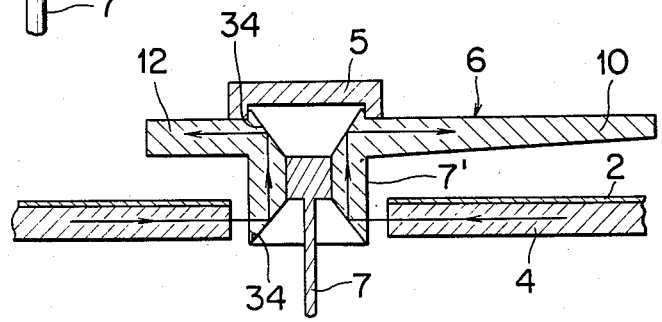
FIG. 2 is a sectional view showing the pointer illuminating structure of FIG. 1.
Figure 3:
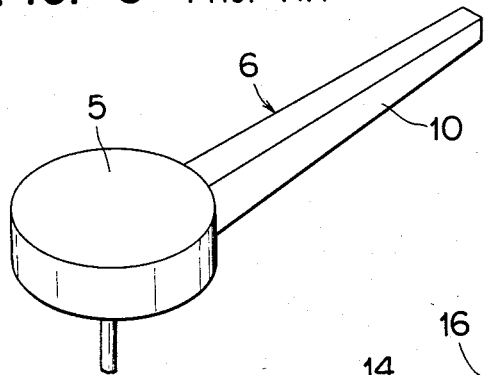
FIG. 3 is a perspective view of another type of the pointer illuminating structure.
Figure 4:
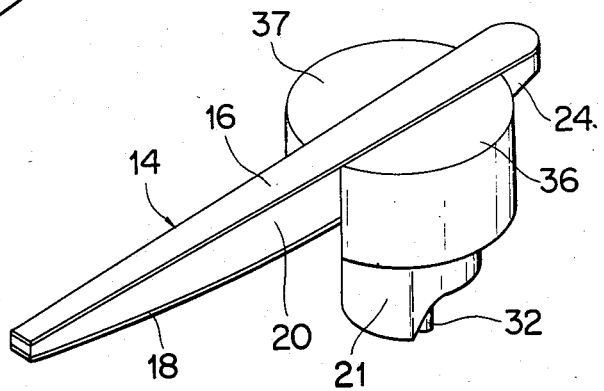
FIG. 4 is a perspective view of one embodiment of the pointer illuminating structure in a measuring instrument according to the present invention.
Figure 5:
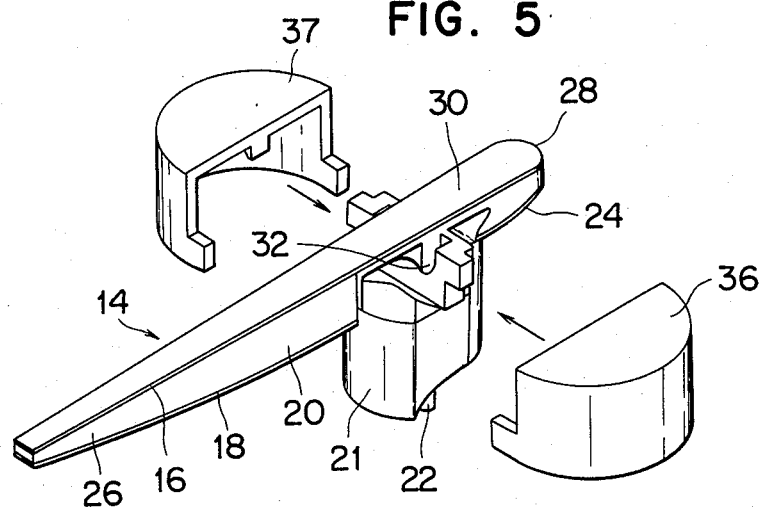
FIG. 5 is an exploded perspective view of the embodiment of FIG. 4.

In FIG. 4, the numeral 14 denotes an elongated pointer body composed of an upper transmissive colored portion 16, lower reflective colored portions 18, 24 and a transparent portion 20 formed of a transparent resin between those upper and lower colored portions, the coloring being effected by two-color molding coating, or any other suitable method. These component portions are formed by insert molding or press-fit molding integrally with a pointer support shaft 22 which is used for connecting the pointer to the measuring instrument intreior (not shown). A more detailed explanation will now be made with reference to FIG. 5. Said transparent portion 20 of the pointer body 14 has a light inducing section 21 at an intermediate portion thereof. Said light inducing section 21 extends substantially perpendicularly to the generally elongated structure to form a T shape. Said transparent portion 20 has a substantially flat upper surface and lower surfaces extending from both sides of said light inducing section 21. The lower reflective colored portion 24, which is formed at the rear end of the pointer, may be differently shaped to keep weight balance of the entirety of the pointer 14. The upper transmissive colored portion 16 is applied to said flat upper surface of the transparent portion 20 and comprises a fore end part 26 for pointing to a scale mark on a dial plate (see 40 in FIG. 6) and a rear end part 28 having a design effect. Said lower reflective colored portions 18 and 24 are applied to said lower surfaces of the transparent portions 20.

Further, in order to conduct refracted and reflected light rays of the introduced light to the upper fore end part 26, upper rear end part 28 and central upper surface 30 of the pointer effectively and uniformly, there is provided a central reflecting portion 32 at the central part of the pointer (above the transparent portion 20 overlying the pointer support shaft 22).

A pair of divided pointer caps 36 and 37 are for covering sideways the other portions than the printer portion to be illuminated including the upper surface 30 to intercept light from the central reflecting portion 32. The pointer caps 36 and 37, formed of a suitably colored resin or a light non-transmissive light metal such as an aluminum plate, are attached to both side faces of the pointer 14 by welding, fitting or any other suitable method.

Operation of the device shown in FIG. 4 will now be described with reference to FIG. 6. Light from a light source (not shown) passes as indicated with arrows through a photoconductive plate 42 mounted on the back of a dial plate 40 of the measuring instrument, then is reflected in a vertical direction by a lower conical light introducing portion 44 of the pointer 14 and introduced to the central reflecting portion 32. Of importance in this connection is that the central reflecting portion 32 is formed with reflective surfaces 46 and 48 defining cavities laterally extending beneath said flat upper surface and above levels of said lower surfaces of the transparent portions 20 to open sideways.

The reflective surface 48 reflects light to the upper fore end part 26 of the pointer, while the reflective surface 46 is in a shape gradually approaching a horizontal plane thereby allowing light to transmit upwards therethrough to prevent unevennes in brightness caused by an abrupt change in luminance between the front and the rear above the reflective surface. Further, reflective surface corner portions 50, 52 and 54 are curved to prevent light from being localized to form a shadow.

A rear hollow reflecting portion 56 also functions to diffuse light forward, upward and rearward uniformly.

Such hollow curved reflecting portions are formed, for example, by drawing sideways of the pointer at the time of molding operation.

Figure 7:
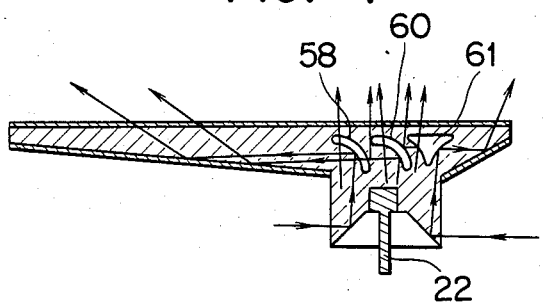
FIG. 7 is a sectional view showing another embodiment of the invention and illustrating the operation thereof.
Figure 8:
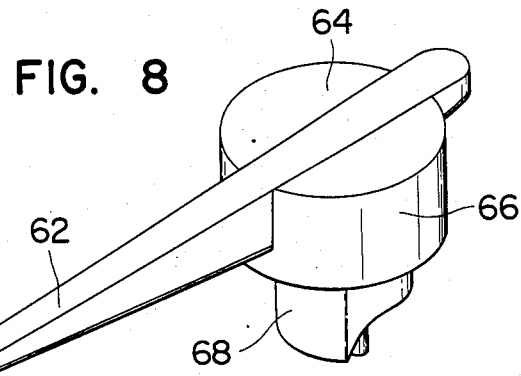
FIG. 8 is a perspective view of a further embodiment of the invention.
Figure 9:
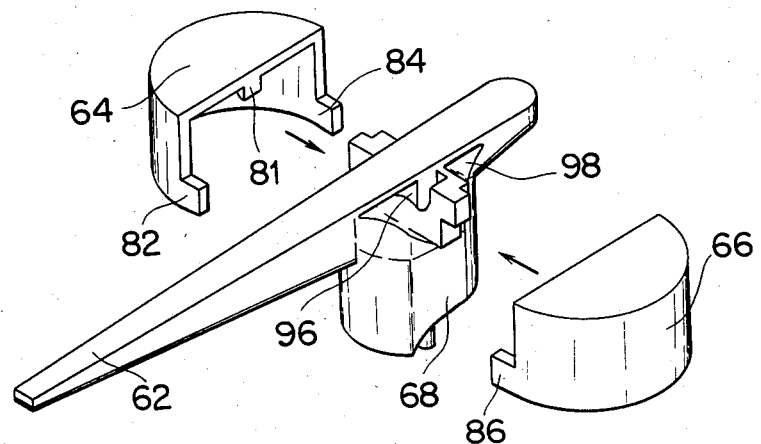
FIG. 9 is an exploded view of the embodiment of FIG. 8.

FIG. 7 is a sectional view of a pointer illuminating device according to another embodiment of the present invention, which is characteristic in that there are formed three hollow curved reflecting portions—front reflecting portion 58, central reflecting portion 60 and rear reflecting portion 61.

Figure 6:
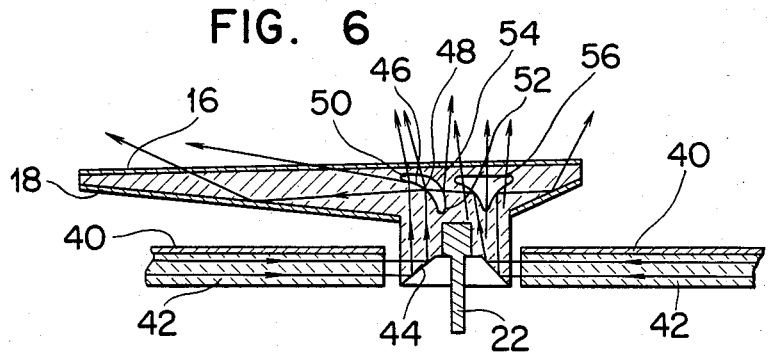
FIG. 6 is a sectional view explaining the operation of the embodiment of FIG. 4.

The function of the reflecting portions 58 and 60 is the same as that in FIG. 6, but in the case of a large pointer, such an increase in the number of reflecting portions permits an efficient conduction of incident light to the front and rear ends of the pointer, affords a sufficient diffusibility upwards and thus permits a uniform illumination of the entirety of the pointer.

Another embodiment of the present invention will be described with reference to FIGS. 8 to 13. As shown in FIG. 13, the entire upper surface of a pointer body 62 is exposed, and a pair of cylindrical split caps with ceiling 64 and 66 are attached to the pointer body 62 sideways by fitting (see FIG. 9). The numeral 94 denotes a transparent, central light receiving portion for conducting light to the pointer body 62.

Figure 10:
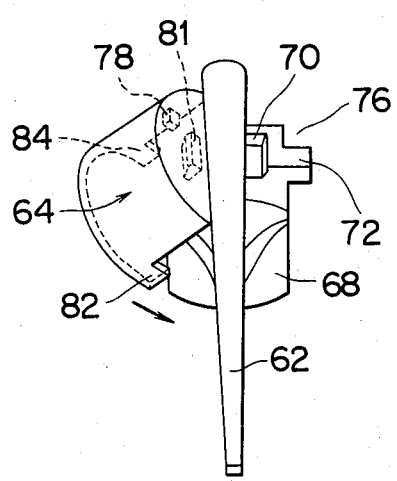
FIG. 10 is a perspective view illustrative of mounting of a cap in the embodiment of FIG. 8.
Figure 11:
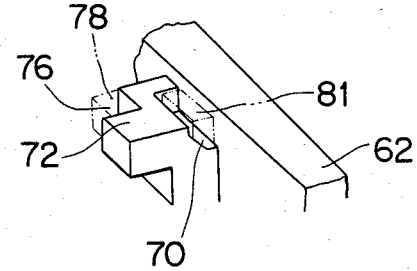
FIG. 11 is a partially enlarged view of FIG. 10.
Figure 12:
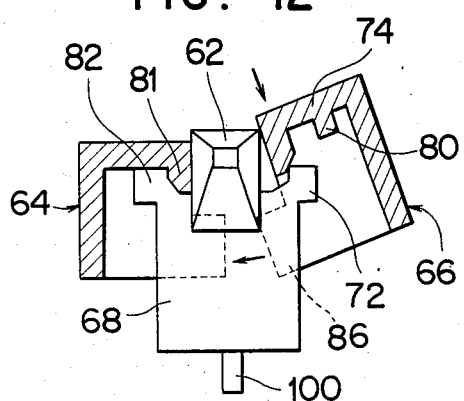
FIG. 12 is a transverse sectional view of FIG. 9.
Figure 13:
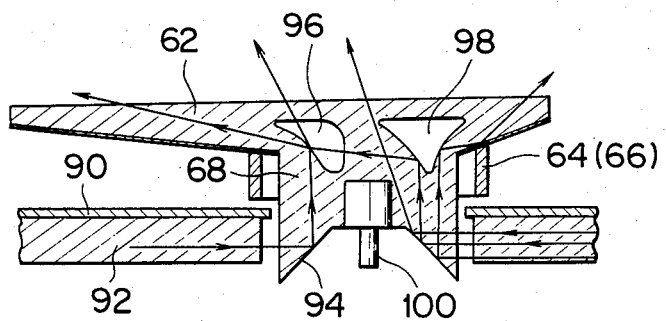
FIG. 13 is a longitudinal sectional view of the FIG. 8 showing the operation thereof.

The following description is now provided about how to mount and remove the caps 64 and 66 with reference to FIGS. 10 to 12.

On each of both upper right and left sides of the central light receiving portion 94 of the pointer 62 is formed an arm portion having a recess 70 and a projection 72. Also on the back of the cap 64 (66) to be engaged with the arm portion are formed a projection 81 (74) for engagement with the recess 70 and a projection 78 (80) for engagement with a notched part 76 of the projection 72 of the arm portion. Therefore, simply by pushing the cap 64 (66) from above, its position is decided, and it will never float ecdentrically back and forth in the logitudinal direction of the pointer body 62.

Further, the cap 64 (66) is provided with a pair of lugs 82 and 84 (86 and 88) in front and rear positions of its lower end. Engagement of these lugs with the bottom of the pointer body 62 ensures fixing of the cap 64 (66) without floating in any directions.

The cap 64 (66) can be removed by first pulling out the lugs 82 and 84 (86 and 88) conversely to the arrow shown in FIG. 10.

In order to make such mounting and removal of the caps easier and more assured, it is preferable that the caps be formed of a highly elastic material such as an opaque resin or a metallic sheet. Being opaque is necessary for the prevention of light leak.

The pointer is illuminated in the following manner. In this connection, reference is made to FIG. 13.

Light from a light source (not shown) passes like arrows through a photoconductive plate 92 attached to the back of a dial plate 90 of the measuring instrument, then is reflected by a lower, conical, light introducing part 94 of the central light receiving portion 68 and conducted toward the pointer body 62 positioned above. Above the central light receiving portion 68 are formed cavities 96 and 98 having curved surfaces. Being reflected by these curved surfaces, light rays reach even the fore and rear end portions of the pointer body 62 uniformly, whereby the entirety of the pointer body 62 can be illuminated uniformly. The numeral 100 denotes a pointer support shaft.

Figure 14:
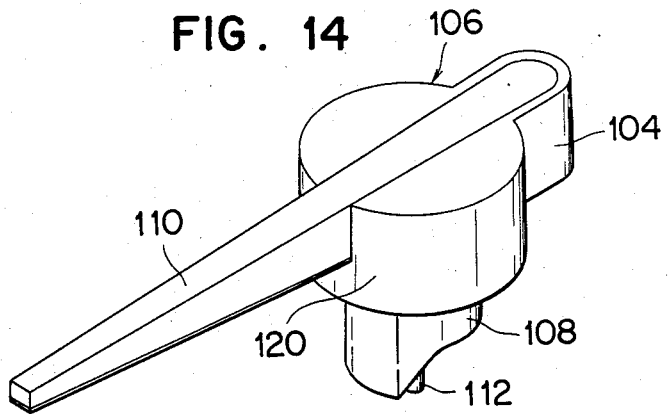
FIG. 14 is a perspective view showing a still further embodiment of the invention.
Figure 15:
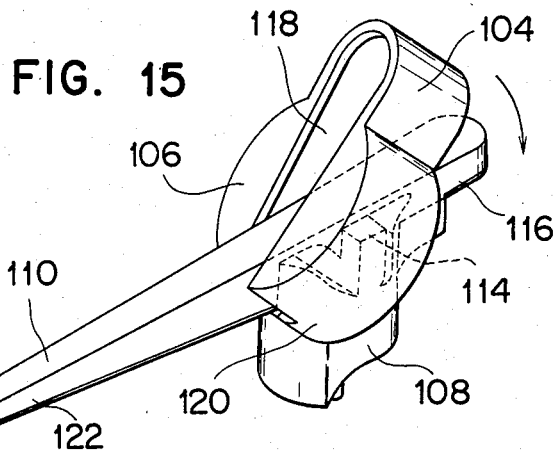
FIG. 15 is an exploded perspective view of FIG. 14.

A further embodiment will be described with reference to FIGS. 14 to 16. FIG. 14 is a perspective view of a pointer for measuring instruments according to this embodiment, and FIG. 15 is an exploded perspective view thereof.

As shown in FIG. 14, the entire upper surface of a pointer body 110 is exposed, and a front lower part of its intermediate portion, both side portions and a rear end portion are covered with an integral cap 106. The numeral 108 denotes a transparent, central light receiving portion for conducting light to the pointer body 110, and the numeral 112 denotes a pointer support shaft.

On both sides of the intermediate portion of the pointer body 110 are formed projections 114, and a stepped portion 116 is formed on the lower surface of the rear end portion thereof.

The integral cap 106 has a central notched portion 118 for exposing the upper surface of the pointer body 110, a front lower strap portion 120 which is in contact with the bottom of the pointer body 110, and a stepped portion 126 of a rear strap portion 104 which stepped portion is adapted to engage the stepped portion 116 of the pointer body 110.

The cap 106 can be mounted and removed in the following manner with respect to the pointer body 110.

Figure 16:
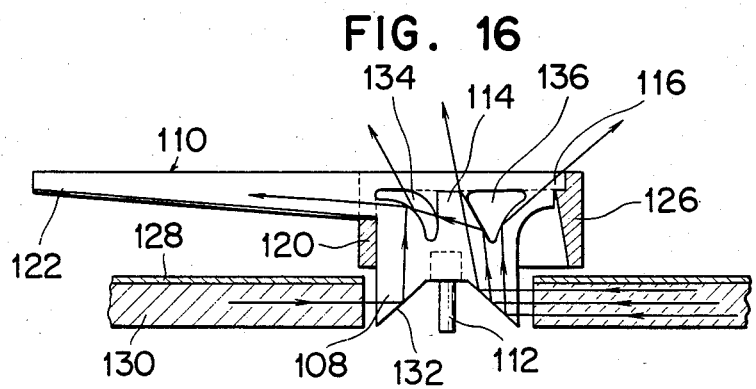
FIG. 16 is a longitudinal sectional view of FIG. 14, showing the operation thereof.

First, as shown in FIG. 16, a fore end portion 122 of the pointer body 110 is inserted from below through the central notched portion 118 of the cap 106. Then, with the front lower strap portion 120 of the cap 106 in contact with the bottom of the pointer body 110 as a fulcrum, the back of the cap 106 is pushed against the projections 114 of the pointer body 110, thereby pushing in the cap 106 to the pointer body 110 side. At this time, the stepped portion 126 at the rear end of the cap 106 undergoes an elastic deformation and is engaged with the stepped portion 116 of the pointer body 110. Thus, the cap 106 is mounted in a predetermined position easily and surely by engagement of its front lower strap portion 120 and rear stepped portion 126 with the pointer body 110.

The cap 106 can be removed by disengaging its rear stepped portion 126 from the pointer body 110 in a direction reverse to the arrow shown in FIG. 16 and pulling out the pointer body 110 from the central notched portion 118 of the cap 106.

In order to make such mounting and removal of the cap easier and more assured, it is preferable that the cap be formed of a highly elastic materila such as an opaque resin or a metallic sheet. Being opaque is necessary for the prevention of light leak.

The pointer is illuminated in the following manner. In this connection, reference is made to FIG. 15.

Light from a light source passes like arrows through a photoconductive plate 130 attached to the back of a dial plate 128 of the measuring instrument, then is reflected by a lower, conical, light introducing part 132 of the central light receiving portion 108 and conducted toward the pointer body 110 positioned above. Above the central light receiving portion 108 are formed cavities 132 and 136 having curved surfaces. Being reflected by these curved surfaces, light rays reach even the fore and rear end portions of the pointer body 110 uniformly, whereby the entirety of the pointer body 110 can be uniformly illuminated.

Figure 17:
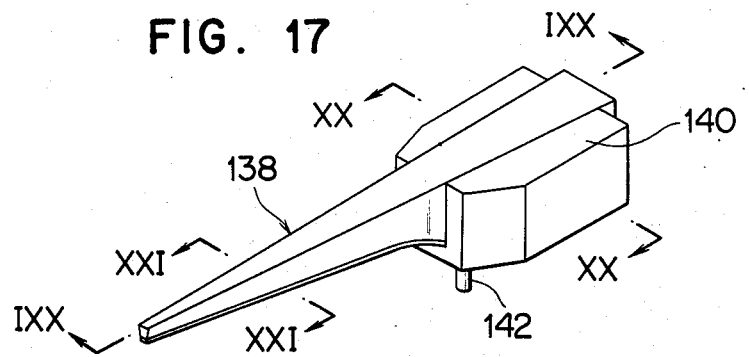
FIG. 17 is a perspective view of a still further embodiment of the invention.

A still further embodiment of the invention will be described with reference to FIGS. 17 to 21. As shown in FIG. 17, the entire surface of a pointer body 138 is exposed, and both side faces of its intermediate and rear end portions are covered with an integral cap 140. The numeral 142 denotes a pointer support shaft.

Figure 18:
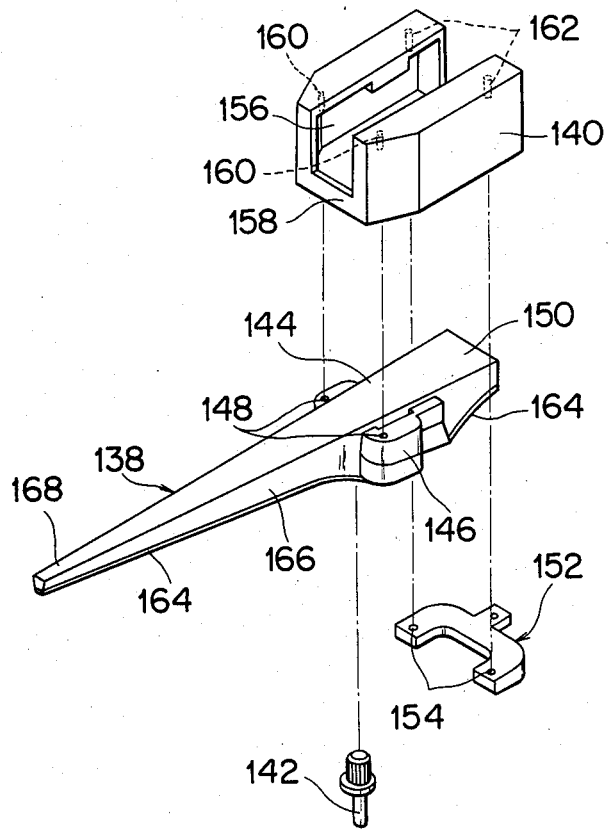
FIG. 18 is an exploded perspective view of FIG. 17.

As shown in FIG. 18, reflective projections 146 are formed on both side faces of an intermediate portion 144 of the pointer body 138, with a positioning hole 148 being formed in the upper surface of each reflective projection 146. Further, to the bottom of a rear end portion 150 of the pointer body 138 is attached a balancer 152 for taking a momental balance in front and in the rear with the support shaft 142 as the center. Also in the upper surface of the balancer 152 are formed positioning holes 154.

On the other hand, the cap 140 has a central opening portion 156 for exposing the upper surface of the pointer body 138 wholly from a fore end portion 168 through the central portion 144 up to the rear end portion 150, a front lower strap portion 158 which is in contact with the bottom of the pointer body 138, bosses 160 provided on the back of the cap for engagement with the positioning holes 148 of the reflective projections 146, and bosses 162 provided on the back of the cap for engagement with the positioning holes 154 of the balancer 152.

The numeral 164 denotes a colored portion which constitutes the bottom of the pointer body 138, and the numeral 166 denotes a colorless transparent portion.

The cap 140 can be mounted to the pointer body 138 by inserting the fore end portion 168 of the pointer body 138 through the central opening portion 156 of the cap 140 and then pushing in the cap 140 with its front lower strap portion 158 as a fulcrum until the bosses 160 and 162 are fitted in the positioning holes 148 and 154.

The cap 140 can be removed in the reverse procedure, that is, by first pulling out the cap 140 to disengage its bosses from the positioning holes 148 and 154 and then pulling out the pointer body 138 from the central opening portion 156 of the cap 140.

In order to make such mounting and removal of the cap 140 easier and more assured, it is preferable that the cap 140 be formed of a highly elastic material such as an opaque resin or a metallic sheet. Being opaque is for preventing the leak of light.

Figure 20:
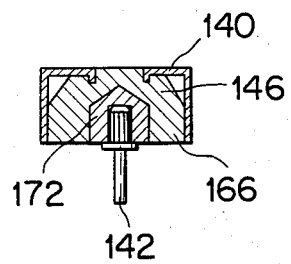
FIGS. 19, 20 and 21 are sectional views taken along lines IXX, XX and XXI of FIG. 17.
Figure 21:
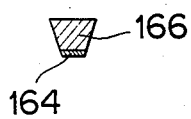
Figure 19:
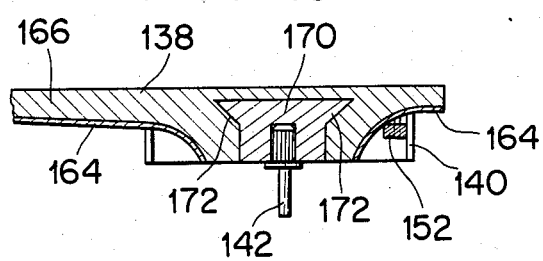

FIGS. 19, 20 and 21 are sectional views taken on lines IXX—IXX, XX—XX and XXI—XXI of FIG. 17, respectively.

In FIGS. 19 and 20, the numeral 170 denotes an opaque colored element fitted into the cavity in the colorless transparent portion 166 formed in the same manner as in the embodiment of FIG. 6, to which is mounted the pointer support shaft 142. The colored portion 170 has slant faces serving as reflective surfaces 172, which reflect and conduct incident light up to the fore and rear end portions 168 and 174 of the pointer.

The pointer is illuminated in the following manner. In this connection, reference is made to FIGS. 22 to 24.

Figure 23:
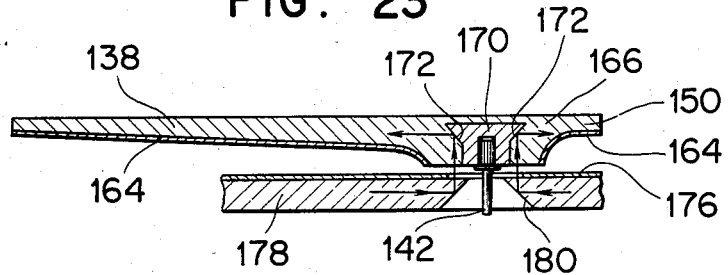

Light from a light source (not shown) passes through a photoconductive plate 178 attached to the back of a dial plate 176 of the measuring instrument then is reflected vertically upward by a conical reflective portion 180 in which is inserted the pointer support shaft 142, and conducted to the transparent portion 166 of the pointer body 138 as indicated with arrows in FIG. 23. Then, the light rays are reflected by the refletive surfaces 172 of the opaque colored portion 170 and reach the fore and rear end portions 168 and 174 of the pointer as shown in the same figure.

Figure 24:
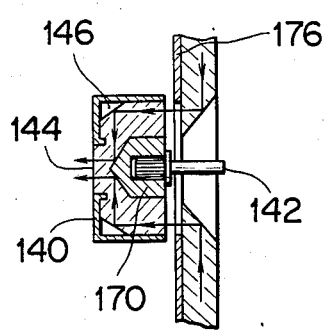
FIGS. 22, 23 and 24 are plan view and sectional views illuminating operation of the embodiment of FIG. 17.
Figure 22:
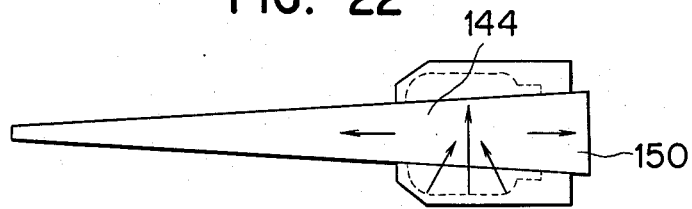

At the same time, as shown in FIGS. 22 and 24, light rays are once reflected by the reflective projections 146, then again reflected by the opaque colored portion 170 and reach the central portion 144, too, of the pointer body 138.

Consequently, the pointer body 138 is illuminated uniformly from its fore end portion 168 through its central portion 144 up to its rear end portion 150, that is, the pointer body 138 can be illuminated as a single continuous line.

Figure 25:
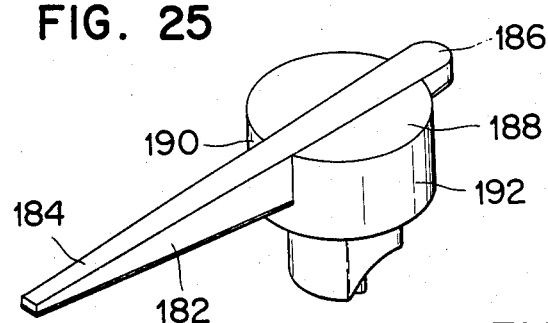
FIG. 25 is a perspective view of a still further embodiment of the invention.

A still further embodiment of the present invention will be described with reference to FIGS. 25, 26 and 27, in which indicated at 182 is a pointer body, at 184 a fore end portion thereof and at 186 a rear end portion thereof. The numeral 188 denotes a cap which is composed of semi-cylindrical bodies 190 and 192 each having a ceiling. The semi-cylindrical bodies 190 and 192 are integrally attached by suitable means such as welding or fitting to the side faces of the pointer body 182 so as to cover a photoconductive portion as will be described hereinafter.

Figure 26:
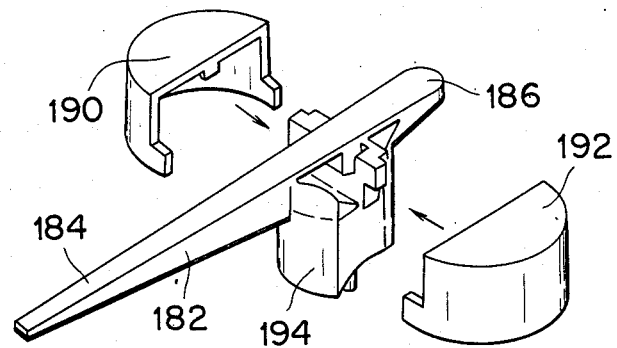
FIG. 26 is an exploded perspective view of FIG. 25.
Figure 27:
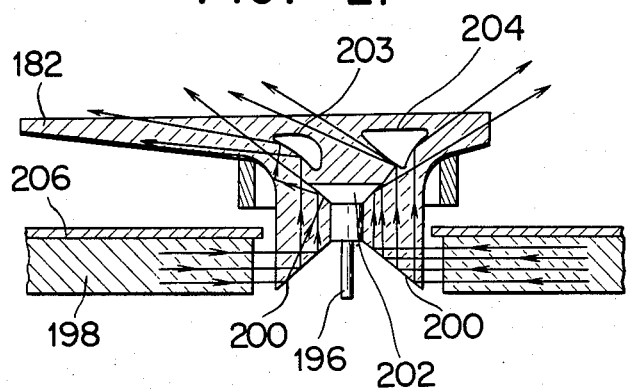
FIG. 27 is a longitudinal sectional view of FIG. 25.

As shown in detail in FIGS. 26 and 27, a photoconductive portion 194 is formed by integral molding with the pointer body 182 so that it is projecting orthogonally to the longitudinal direction of the pointer body 182, with a pointer support shaft 196 being inserted in the lower end of the photoconductive portion 194. The pointer support shaft 196 is connected to a diriving shaft of a measuring instrument (not shown) to support the entire of the measuring body 182.

The photoconductive portion 194 has a conical light introducing part 200 for receiving illuminating light from a photoconductive plate 198 and reflecting it upward and an inverted truncated cone-like reflecting part 202 for intercepting and reflecting part of the light reflected by the conical light introducing part 200, the light introcuding part 200 and the reflecting part 202 being positioned concentrically with the pointer support shaft 196. The photoconductive portion 194 is further provided, in positions above the inverted truncated cone-like reflecting part 202, with a front reflective cavity part 203 for reflecting the light rays reflected by the above parts toward the front end portion 184 of the pointer body 182 and a rear reflective cavity part 204 for reflecting those light rays toward the rear end portion 186.

In such construction, illuminating light obtained through the photoconductive plate 198 attached to the back of a dial plate 206 is received and refracted upward by the conical light introducing part 200 of the photoconductive portion 194. Part of the thus-reflected light advances upward, while the remaining part is reflected outwardly of the photoconductive portion 194 by the inverted truncated cone-like reflecting part 202, then further reflected by the peripheral surface of the photoconductive portion 194 and becomes an upward illuminating light. The greater part of the illuminating light is reflected toward the fore end portion 184 and rear end portion 186 of the pointer body 182 by the front reflective cavity part 203 and rear reflective cavity part 204. Thus, the reflected light advancing upwardly of the photoconductive portion 194 is reflected in the outer peripheral direction of the latter by the action of the inverted truncated cone-like reflecting part 202. Consequently, a sufficient diffusion can be attained while suppressing convergence of light, that is, the illuminating efficiency can be improved.

The inverted truncated cone-like reflecting part 202 may be changed in its size and the angle of its reflective portion according to the shape of the pointer body 182.

By the aforementioned reflecting actions of the component parts, the pointer body 182 can be illuminated uniformly throughout its overall length.

A still further embodiment of the invention will be described in detail hereinunder with reference to FIGS. 28a to 31.

Figure 28A:
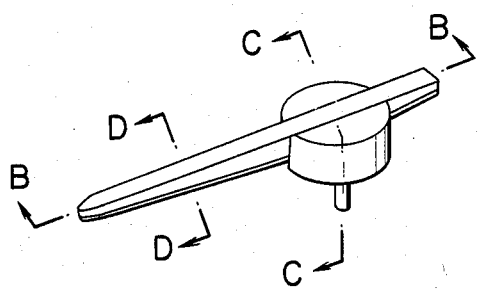
FIG. 28a is a perspective view of a still further embodiment of the invention.
Figure 28C:
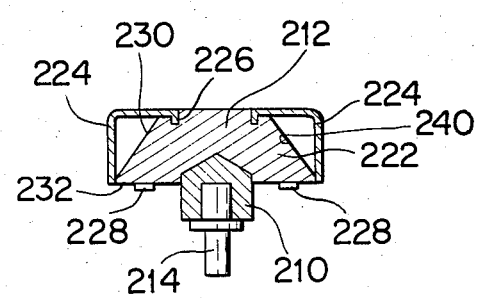
Figure 28B:
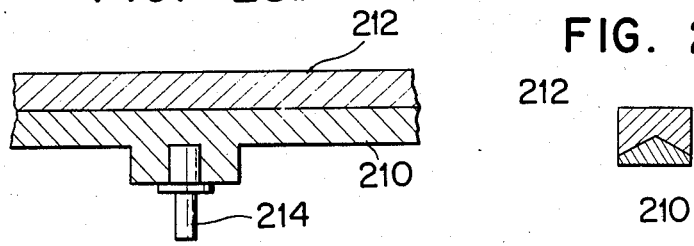
Figure 28D:
Figure 30:
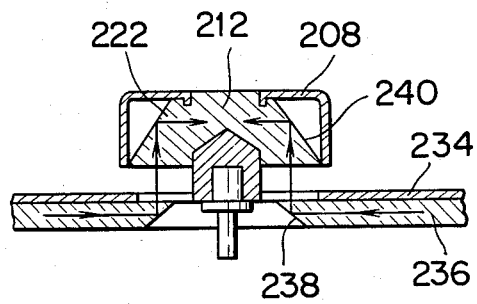
Figure 34C:
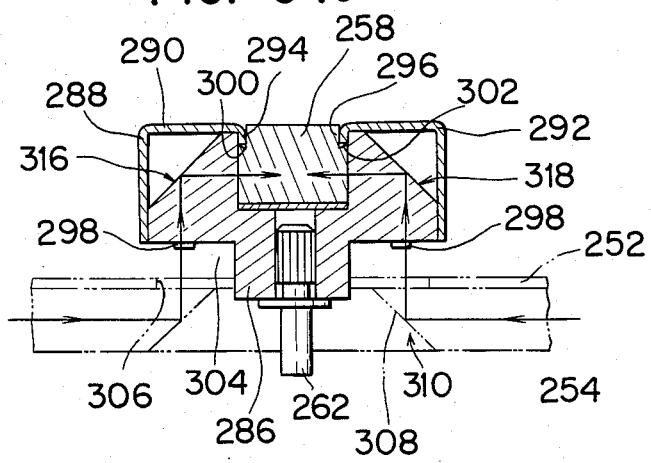
Figure 35:
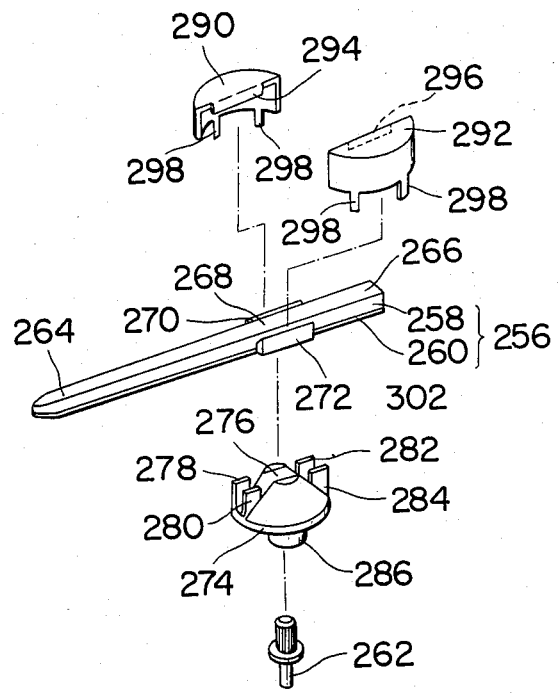
Figure 36:
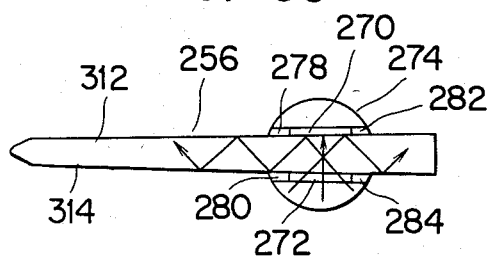
FIG. 36 is a plan view of a pointer and holder portion for explaining the operation of this embodiment.
Figure 37:
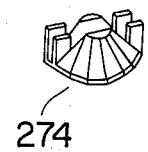
FIG. 37 is a perspective view showing another modification of the holder portion.
Figure 38:
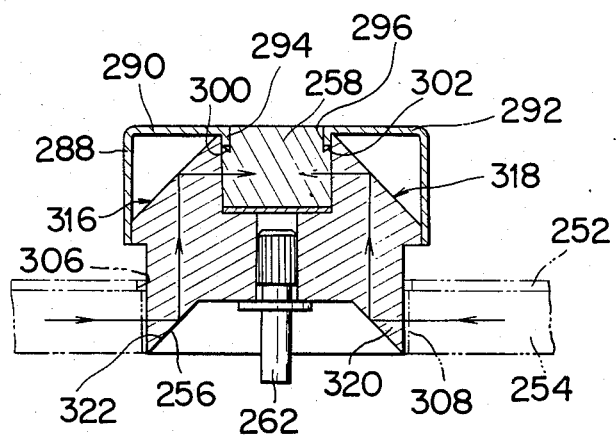
FIG. 38 is a setional view similar to FIG. 34 showing another modification thereof.

FIG. 28a is a general view of a pointer illuminating structure as assembled according to this embodiment; FIG. 28b is a sectional view taken on line B—B of FIG. 28a, showing a principal portion; FIG. 28c is a sectional view taken on line C—C of FIG. 28a; FIG. 28d is a sectional view taken on line D—D of FIG. 28a; FIG. 29 illustrates the construction of the pointer illuminating device; and FIGS. 30 and 31 illustrate the operation thereof. Referring to those figures, an elongated transparent pointer element 212 has a light inducing section 222 at an intermediate portion thereof in the form of a truncated conical portion. Said truncated conical portion has a conical reflective surface 240. Said transparent pointer element 212 has a substantially flat upper surface. Referring to FIG. 29, a suitably colored portion 210 is applied to the underside of the transparent pointer element 212. Said transparent pointer element 212 is made of a transparent resin and formed by insert molding integrally with a pointer support shaft 214 to be connected to an internal machine (not shown). For coloring, twocolor molding is mainly employed.

The colored portion 210 may be differently shaped to take balance (balance of moment around the pointer support shaft 214) of the entirety of the pointer 210.

The transparent portion 212 has a fore end part 218 for pointing to a scale mark on a dial plate (not shown) of the measuring instrument, a rear end part 220 having a design effect. Said truncated conical portions 222 may be separately formed on both sides of a rectilinear portion of the pointer at the central part of the transparent portion 212 for conducting the refraction of light effectively to the fore end part 218 and rear end part 220 of the pointer 208 as will be described later.

Pointer caps 224 are for covering the other portions than the pointer portion to be illuminated, and are formed of a suitably colored resin or formed of a light metal such as an aluminum plate and colored.

The pointer caps 224, for their fixing to the semi-conical reflecting portions 222, are each provided with a positioning guide portion 226 and, if they are formed of a metallic plate, are also provided with lugs 228 in suitable positions.

The positioning guide portions 226 of the pointer caps 224 are fitted in grooves 230 formed in the semi-conical reflecting portions 222 of the pointer 208, and the lugs 228 are bent inwards along a bottom of each reflecting portion 222, whereby the paired pointer caps 224 can be attached to the pointer 208.

Operation of the present invention will be described below with reference to FIGS. 30 and 31.